(12) United States Patent
Tinker

(10) Patent No.: US 7,453,288 B2
(45) Date of Patent: Nov. 18, 2008

(54) CLOCK TRANSLATOR AND PARALLEL TO SERIAL CONVERTER

(75) Inventor: Darrell Eugene Tinker, Austin, TX (US)

(73) Assignee: Sigmatel, Inc., Austin, TX (US)

( * ) Notice: Subject to any disclaimer, the term of this patent is extended or adjusted under 35 U.S.C. 154(b) by 127 days.

(21) Appl. No.: 11/356,227

(22) Filed: Feb. 16, 2006

(65) Prior Publication Data

US 2007/0200642 A1 Aug. 30, 2007

(51) Int. Cl.
*H03K 19/00* (2006.01)
(52) U.S. Cl. ...................................... 326/93
(58) Field of Classification Search ............. 326/93–98
See application file for complete search history.

(56) References Cited

U.S. PATENT DOCUMENTS

| | | | |
|---|---|---|---|
| 4,625,126 A | 11/1986 | Tinker et al. | |
| 5,185,609 A | 2/1993 | DeBord | |
| 5,559,513 A | 9/1996 | Rothermel et al. | |
| 5,617,344 A | 4/1997 | Young et al. | |
| 5,634,116 A * | 5/1997 | Singer | 713/400 |
| 5,796,995 A * | 8/1998 | Nasserbakht et al. | 713/503 |
| 5,915,028 A | 6/1999 | Chahabadi | |
| 5,949,363 A | 9/1999 | Kosiak et al. | |
| 6,055,619 A | 4/2000 | North et al. | |
| 6,057,793 A | 5/2000 | Gong et al. | |
| 6,175,269 B1 | 1/2001 | Gielis et al. | |
| 6,184,942 B1 | 2/2001 | Patel et al. | |
| 6,208,671 B1 | 3/2001 | Paulous et al. | |
| 6,211,924 B1 | 4/2001 | Patel et al. | |
| 6,310,653 B1 | 10/2001 | Malcolm, Jr. et al. | |
| 6,333,767 B1 | 12/2001 | Patel et al. | |
| 6,362,755 B1 | 3/2002 | Tinker | |
| 6,373,912 B1 | 4/2002 | Yu | |
| 6,480,233 B1 | 11/2002 | Limberg | |
| 6,512,555 B1 | 1/2003 | Patel et al. | |
| 6,523,147 B1 | 2/2003 | Kroeger et al. | |
| 6,526,101 B1 | 2/2003 | Patel et al. | |
| 6,584,145 B1 | 6/2003 | Camagna et al. | |
| 6,584,162 B1 | 6/2003 | Tinker | |
| 6,694,026 B1 | 2/2004 | Green | |
| RE38,456 E | 3/2004 | Patel et al. | |
| 6,700,936 B1 | 3/2004 | Moss | |
| 6,701,140 B1 | 3/2004 | Stine | |
| 6,738,610 B1 | 5/2004 | Wildhagen | |
| 6,778,106 B2 | 8/2004 | Lenez et al. | |
| 6,801,028 B2 | 10/2004 | Kernahan et al. | |
| 7,071,773 B2 | 7/2006 | Kuhn et al. | |
| 7,079,657 B2 | 7/2006 | Wu et al. | |
| 7,106,224 B2 | 9/2006 | Knapp et al. | |
| 7,180,349 B2 * | 2/2007 | Leifso et al. | 327/217 |
| 2001/0040930 A1 | 11/2001 | Abbey | |
| 2004/0032922 A1 | 2/2004 | Knapp et al. | |

(Continued)

*Primary Examiner*—Don P Le
(74) *Attorney, Agent, or Firm*—Toler Law Group

(57) ABSTRACT

A system and method for using one or more clock signals is disclosed. The system includes a clock translator that has a first input to receive a first reference clock signal and a second input to receive a second reference clock signal. The clock translator also includes an output to provide a bit rate clock signal having a clock frequency in a first ratio with respect to the frequency of the first reference clock but having a resolution based on at least a portion of the second reference clock signal. The second reference clock has a faster rate than the first reference clock.

25 Claims, 5 Drawing Sheets

U.S. PATENT DOCUMENTS

| | | |
|---|---|---|
| 2004/0075766 A1 | 4/2004 | Schoner |
| 2004/0264614 A1 | 12/2004 | Tinker |
| 2006/0077300 A1 | 4/2006 | Cheon et al. |
| 2006/0179095 A1 | 8/2006 | Lo Muzio et al. |

\* cited by examiner ated based on the second reference clock signal. The generated bit stream signal is provided as an output signal.
CLOCK TRANSLATOR AND PARALLEL TO SERIAL CONVERTER

FIELD OF THE DISCLOSURE

The present disclosure relates to translation of clock signals and to parallel to serial conversion systems.

BACKGROUND

Conversion of digital signals from a parallel format to a serial format is useful in a variety of applications, including applications requiring communication for electronic devices. A particular electronic device may convert a digital signal from a parallel format to a serial format and transmit the signal in the serial format to a peripheral device. Conversion of a signal from a parallel to a serial format prior to transmission may use a variety of clock signals. For example, different clock signals may be used to sample a digital signal and for conversion of the signal from the parallel to the serial format. It is sometimes useful to synchronize the various clock signals during the conversion process. At high speeds, the frequency of the source clocks used for synchronization may have poor resolution. Accordingly, there is a need for an improved system and method for translating clock signals for parallel to serial conversion of a digital signal.

DESCRIPTION OF THE DRAWINGS

A system and method for using one or more clock signals is disclosed. The system includes a clock translator that has a first input to receive a first reference clock signal and a second input to receive a second reference clock signal. The clock translator also includes an output to provide a bit rate clock signal having a clock frequency in a first ratio with respect to the frequency of the first reference clock but having a resolution based on at least a portion of the second reference clock signal. The second reference clock has a faster rate than the first reference clock.

In a particular embodiment, the system includes a sample rate converter to convert the sample rate of a digital input signal based on a sample rate control input. The system also includes a parallel to serial converter responsive to the sample rate converter to convert a parallel input to a serial output based on a bit clock rate. The system further includes a clock translator. The clock translator includes a first input to receive the sample rate control input, a second input to receive a first reference clock signal and a third input to receive a second reference clock signal. The clock translator also includes an output to provide the bit rate clock signal. The bit rate clock signal has a clock frequency in a first ratio with respect to the frequency of the first reference clock and has a resolution based on at least a portion of the second reference clock signal.

The method includes generating a bit stream signal having a plurality of bit transitions, where the plurality of bit transitions have a frequency in a first ratio with respect to the frequency of a first clock signal and where a first set of the plurality of bit transitions have timing that is derived based on edges of a second clock signal. The generated bit stream signal is provided as an output signal.

Figure 1:
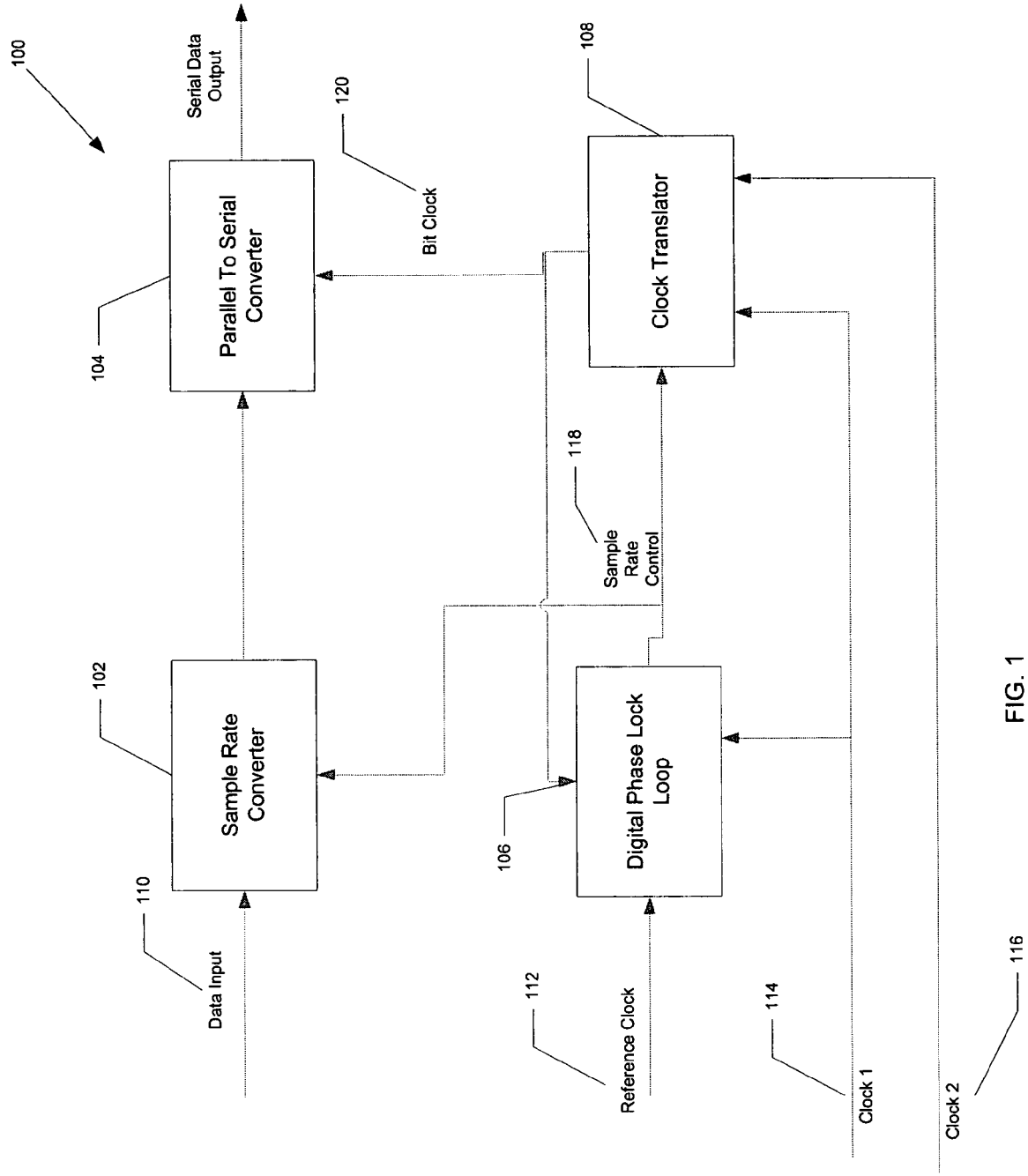
FIG. 1 is a block diagram of an exemplary embodiment of a parallel to serial conversion system.

Referring to FIG. 1, a parallel to serial conversion system 100 is illustrated. The parallel to serial conversion system 100 includes a sample rate converter 102, a parallel to serial converter 104, and a clock translator 108. The parallel to serial converter 104 is responsive to the sample rate converter 102 to convert a parallel input to a serial output. The parallel to serial converter 104 has an input that receives a bit clock signal 120. The parallel to serial conversion system 100 also includes a digital phase lock loop 106 that is responsive to a reference clock signal 112. The digital phase lock loop 106 and the clock translator 108 receive a first reference clock signal 114. The clock translator 108 also receives a second reference clock signal 116. The clock translator 108 receives a sample rate control signal 118 that is provided by the digital phase lock loop 106. The sample rate control signal 118 is also provided to the sample rate converter 102 which has an input for data 110. In a particular embodiment, the sample rate control signal includes an integer portion and a fractional portion.

During operation, the data input 110 is provided to the sample rate converter 102. The sample rate converter 102 is controlled by the sample rate control signal 118 and provides parallel data to the parallel to serial converter 104 to be converted to a serial data output stream. The parallel to serial converter 104 conducts the parallel to serial conversion in response to the bit clock signal 120 that is generated by the clock translator 108. The clock translator 108 includes a first input to receive the sample rate control input 118, a second input to receive the first reference clock signal 114 and a third input to receive the second reference clock signal 116. The clock translator 108 has an output that provides the bit rate clock signal 120. The bit rate clock signal has a clock frequency in a first ratio with respect to the frequency of the first reference clock signal 114. The first ratio is controlled by the sample rate control signal 118. In addition, the bit rate clock signal 120 uses at least a portion of the second reference clock signal 116 to provide for improved resolution. Accordingly, the resolution of the bit rate clock signal 120 is controlled by the second reference clock signal 116, while the frequency of the bit rate clock signal 120 is based on the first reference clock signal 114 and is controlled by the sample rate control signal 118. This allows for better resolution of the bit rate clock signal with the appropriate frequency control.

In a particular embodiment, the bit rate clock signal 120 includes a plurality of transition pulses where a first set of the plurality of transition pulses have a frequency in a first ratio with the frequency of the first reference clock 114 and a set of the plurality of pulses are synchronized with at least some of the second reference clock signal edges 116. Also, the second reference clock signal 116 has a rate that is substantially faster than the rate of the first reference clock signal 114. In a particular illustrative embodiment, the second reference clock signal 116 may be the fastest system clock available in a particular hardware implementation. By using both the first reference clock signal 114 and the second reference clock signal 116 to create the bit rate clock signal 120, improved bit rate clock resolution may be obtained. This can allow for faster conversion or more accurate conversion of the data input 110 to the serial data output stream.

Figure 2:
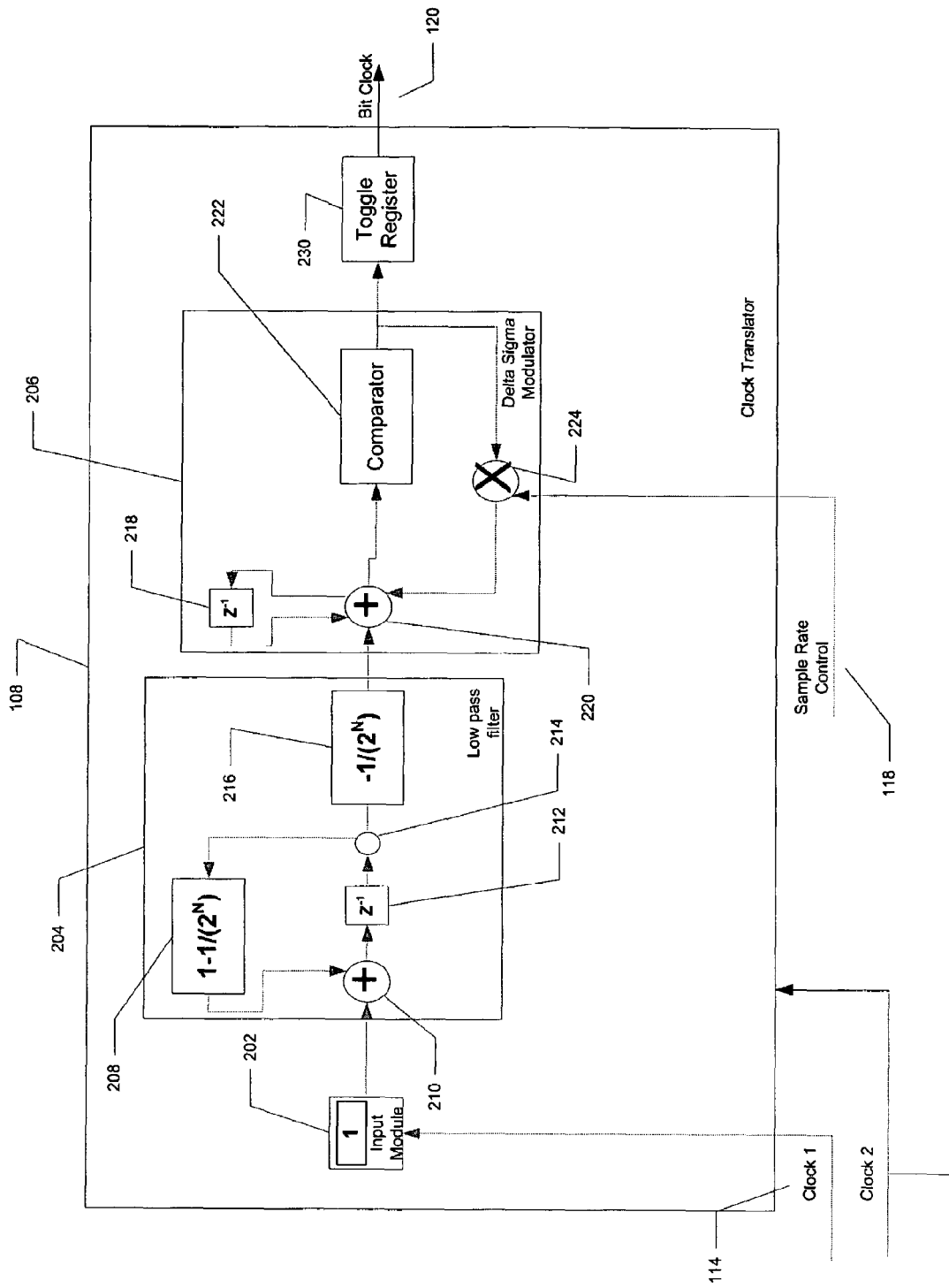
FIG. 2 is a block diagram of a particular embodiment of the clock translator of the system of FIG. 1.

Referring to FIG. 2, a particular illustrative embodiment of the clock translator 108 is shown. The clock translator 108 includes an input module 202, a low pass filter module 204, a delta sigma modulator 206, and a toggle register 230. The input module 202 is responsive to the first clock 114 and the low pass filter 204 is responsive to the second clock 116. The low pass filter 204 is responsive to data from the input module 202. The input module 202 and the low pass filter 204 form a first translation stage to determine a ratio between the rate of the second reference clock 116 and the rate of the first reference clock 114. The clock translator 108 also includes a second translation stage that is responsive to the first translation stage. The second translation stage includes the modulator and provides the toggle signal to the toggle register based on the sample rate control input 118 and in response to the output from the low pass filter 204. The toggle register is responsive to the output of the delta sigma modulator 206 to produce the bit clock signal 120.

In a particular embodiment, the low pass filter 204 may be implemented as having a first integrator 210 followed by a delay element 212. The low pass filter 204 may also include a feedback path including digital logic 208. The feedback path is formed by a combination node 214 that also feeds a feed forward stage 216 for the low pass filter 204 and provides feedback via the integrator 210. The feed forward stage 216 provides the low pass filter 204 output that is fed to an input of the delta sigma modulator 206. In a particular illustrative embodiment, the delta sigma modulator 206 may include an input summer 220, comparative unit 222 and feedback loop including a multiplier 224 that multiplies the delta sigma modulator 206 output with the sample rate control 118. The input summing node 220 also includes additional feedback through delay element 218 to implement the delta sigma modulator function within the delta sigma modulator unit 206. In a particular embodiment, the comparator 222 will output a one when the input summer is negative and will output a zero at other times. The toggle register 230 provides the output bit rate clock signal 120.

During operation, the output of the low pass filter 204 is based on a ratio of the number of pulses in the second reference clock signal 116 to the number of pulses in the first reference clock signal 114. The delta-sigma modulator 206 receives the output of the low pass filter 204 and compares the result to the sample rate control 118. Accordingly, when an integration of the reciprocal of the number of pulses of the second reference clock signal 116 per pulse of the first reference clock signal 114 exceeds the sample rate control 118, the delta sigma modulator produces a toggle signal. This toggle signal is provided to the toggle register 230. In response, the toggle register 230 produces a pulse of the bit rate clock 120.

Figure 3:
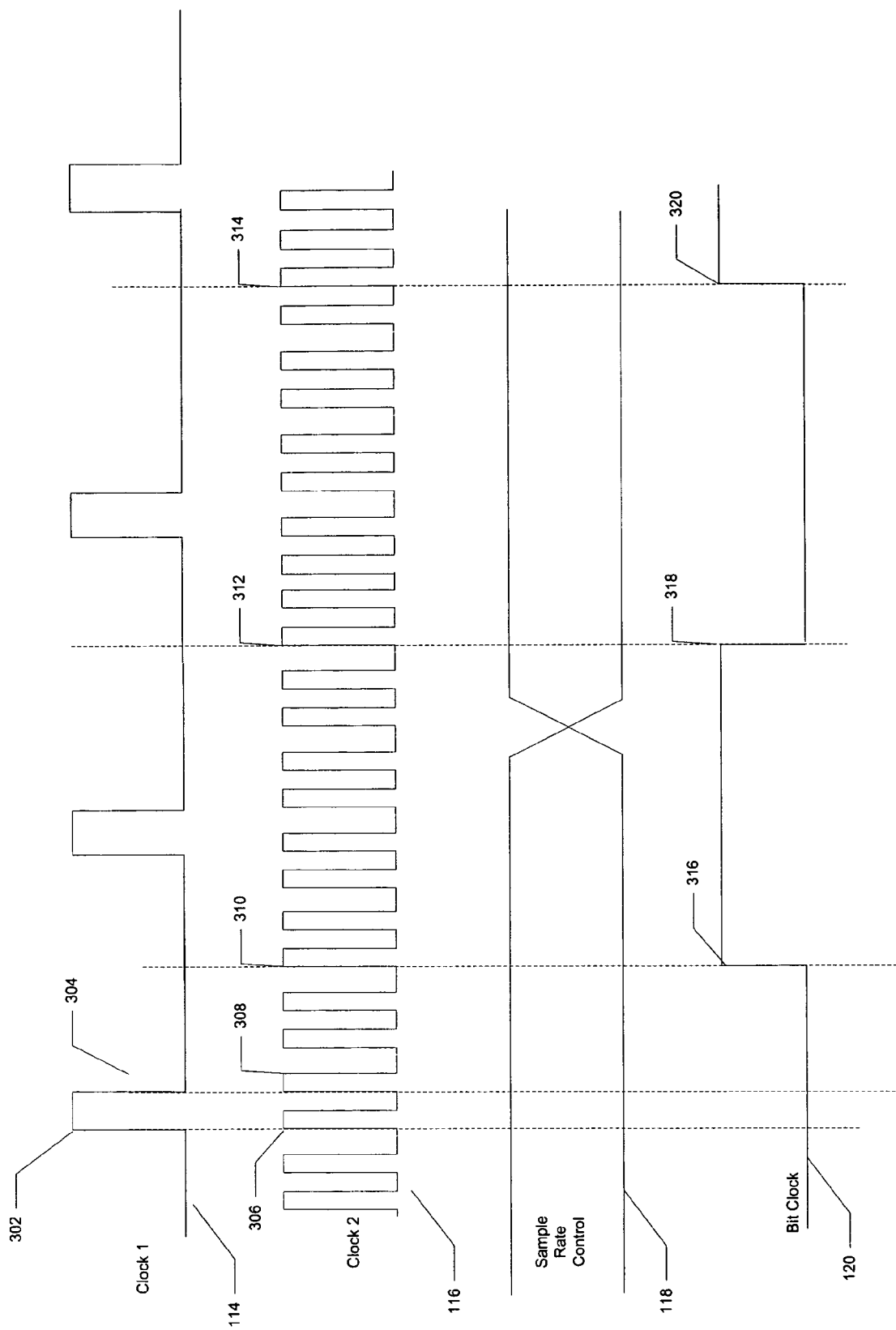
FIG. 3 is a timing diagram that illustrates the clock signals of the system of FIG. 1.

Referring to FIG. 3, a general diagram that illustrates timing and edge transitions of different digital clock signals used with respect to the parallel to serial converter system 100 is shown. The first clock reference signal 114 has a first transition edge 302 and a second transition edge 304. The second reference clock signal 116 has a first identified transition edge 306, a second identified transition edge 308, a third identified transition edge 310, a fourth identified transition edge 312, and a fifth identified transition edge 314. The sample rate control signal 118 includes a at least one transition edge as shown. The generated bit clock signal 120 includes a first illustrative transition edge 316, a second illustrated transition edge 318, and a third illustrated transition edge 320, and a fourth illustrated transition edge 326.

As shown, the first transition edge 302 and the second transition edge 304 of the first reference clock signal are substantially aligned with the first identified transition edge 306 and the second identified transition edge 308 of the second reference clock signal 116. In addition, the first transition edge 316 of the bit clock signal is aligned with the third identified transition edge 310 of the second reference clock signal 116. Further, the first transition edge 316 of the bit clock signal is not aligned with an edge of the first reference clock signal 114. However, as illustrated, the first reference clock signal includes a certain number of pulses for each cycle of the bit clock signal 120. In the illustrated example, the first reference clock signal 114 includes two pulses for each cycle of the bit clock signal 120. Accordingly, the frequency of the bit clock signal 120 is in a ratio with the frequency of the first reference clock signal 114. In a particular embodiment, the ratio is controlled by the sample rate control signal 118.

Further, as illustrated, the edges of the bit clock 120 are synchronized with the edges of the second reference clock signal 116. For example, the edges 316, 318 and 320 of the bit clock signal 120 are synchronized with the edges 310, 312, and 314 of the second reference clock signal 116.

Thus, the generated bit stream signal 120 has a plurality of bit transitions where a frequency of the plurality of bit transitions are in a ratio to the frequency of the first reference clock signal 114 and where a set of the plurality of bit transitions have timing that is substantially aligned with or derived from edges of the second clock signal 116. The second reference clock signal 116 having a faster bit rate than the first reference clock signal 114 is used to adjust or enhance the resolution of the resulting generating bit clock signal 120.

Figure 4:
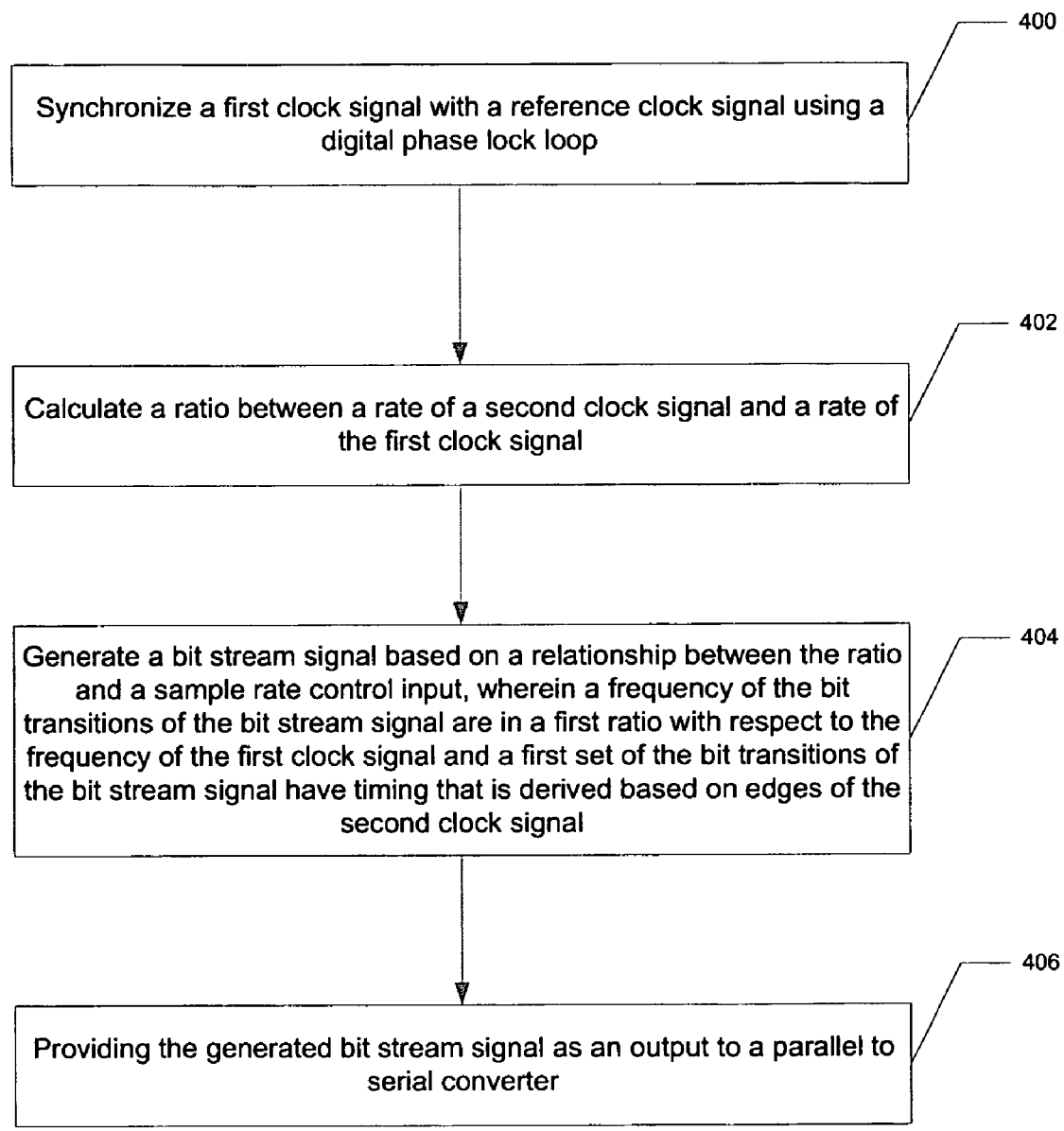
FIG. 4 is a flow chart of a particular embodiment of a method of providing a bit stream.

Referring to FIG. 4, a method of providing a bit stream signal is illustrated. The method includes using a digital phase lock loop to produce a sample rate control input based on a first clock signal and a reference clock signal, at 400. In a particular embodiment, the reference clock signal represents the sample rate of a data input stream. The method further includes calculating a ratio between a rate of a second clock signal and the rate of the first clock signal as shown at 402. The method further includes generating a bit stream signal that is based on the relationship between the determined ratio and the sample rate control input where a portion of bit transitions of the bit stream are in a first ration with respect to the frequency of the first clock signal. In a portion of the bit stream, transitions of the bit stream have timing that is derived based on edges of the second clock signal, as shown at 404. The method further includes providing the generated bit stream signal as an output to a parallel/serial converter, at 406. In a particular embodiment, the generated bit stream signal is based on the determined multi-clock ratio and on the sample rate control input. In addition, the bit stream signal may be provided as an input to the parallel/serial converter and a resulting output serial data stream may be provided therefrom.

Figure 5:
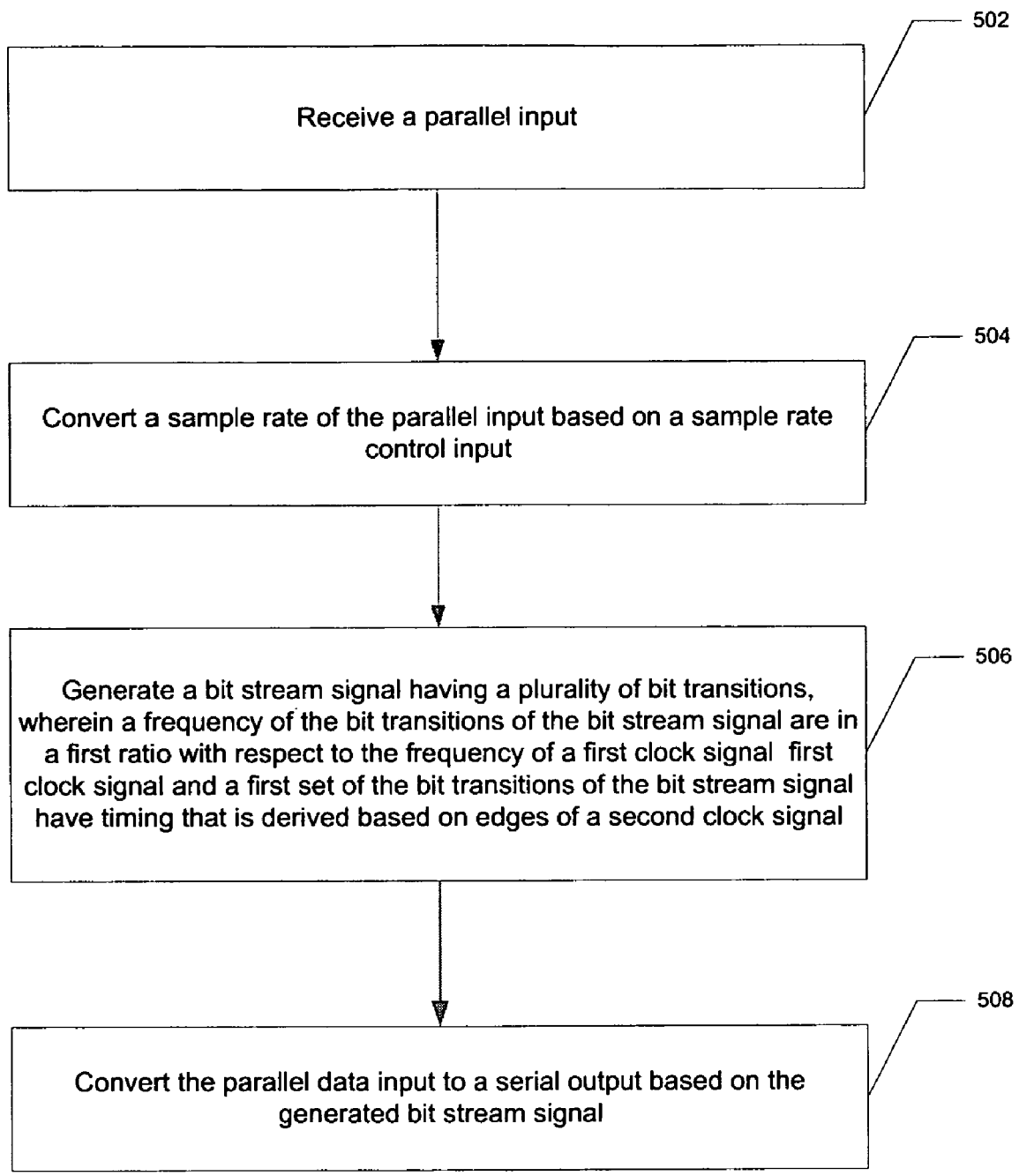
FIG. 5 is a flow chart of a particular embodiment of a method of converting a parallel input to a serial output.

Referring to FIG. 5, a method of converting a parallel data input to a serial data output is illustrated. The method includes receiving a parallel data input, at 502, and converting a sample rate of the parallel data input signal based on a sample rate control signal, at 504. The method further includes generating a bit stream signal having a plurality of bit transitions where the frequency of the plurality of transitions are in a ratio with the frequency of a first clock signal, and where a set of the plurality of bit transitions have timing that is derived based on edges of a second clock signal, as shown at 506. Thus, the generated bit stream signal has a frequency in a ratio with a first clock signal rate which may be at a slower rate, but the generated bit stream signal has intermediate edge transitions to provide for enhanced resolution using an asynchronous second clock signal having a faster clock rate. The method further includes converting a sample rate of the parallel data input based on a sample rate control signal, at 508. The method further includes providing the serial output data in response to an output of a sample rate converter and in response to the generated bit stream signal provided. The resulting bit stream signal may be used in the parallel to serial converter and beneficially provides a high resolution input signal for the conversion.

The above disclosed subject matter is to be considered illustrative, and not restrictive, and the appended claims are intended to cover all such modifications, enhancements, and other embodiments which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A clock translator, comprising:
   a first input to receive a first reference clock signal;
   a second input to receive a second reference clock signal;
   an output to provide a bit rate clock signal having a clock frequency in a first ratio with respect to a frequency of the first reference clock signal but having a resolution based on at least a portion of the second reference clock signal;
   wherein the bit rate clock signal is provided to a parallel to serial converter.

2. The clock translator of claim 1, wherein a rate of the first reference clock signal is asynchronous with respect to the second reference clock signal.

3. The clock translator of claim 1, wherein the bit rate clock signal includes a plurality of pulses, and wherein the plurality of pulses have a frequency in a first ratio with respect to the frequency of the first reference clock signal and wherein a first set of the plurality of pulses are synchronized with edge transitions of the second reference clock signal.

4. The clock translator of claim 1, wherein the second reference clock signal is at a faster rate than the first reference clock signal.

5. The clock translator of claim 1, further comprising:
   a third input to receive a sample rate control input, wherein the first ratio is controlled by the sample rate control input.

6. The clock translator of claim 5, wherein the sample rate control input is a sample rate control input of a sample rate converter.

7. The clock translator of claim 5, wherein the sample rate control input is provided by a digital phase lock loop.

8. The clock translator of claim 5, further comprising:
   a first translation stage to calculate a second ratio between a rate of the second reference clock signal and a rate of the first reference clock signal;
   a second translation stage responsive to the first translation stage to provide the bit rate clock signal based on the sample rate control input.

9. The clock translator of claim 8, wherein the first translation stage includes an input module responsive to the first reference clock signal and a low pass filter responsive to the input module.

10. The clock translator of claim 9, wherein the low pass filter comprises an integrator, a feed forward value, and wherein the magnitude of the feed forward value is substantially subtracted from the integrator.

11. The clock translator of claim 8, wherein the second translation stage includes a delta-sigma modulator responsive to the sample rate control input.

12. The clock translator of claim 11, wherein the second translation stage comprises an accumulator responsive to the first translation stage, a comparator responsive to the accumulator and to a reference value, wherein the accumulator is further responsive to the sample rate control input when the comparator indicates a favorable condition of the accumulator with respect to the reference value.

13. The clock translator of claim 12, wherein the reference value is zero.

14. A clock translator, comprising:
    a first input to receive a first reference clock signal;
    a second input to receive a second reference clock signal;
    an output to provide a bit rate clock signal having a clock frequency in a first ratio with respect to a frequency of the first reference clock signal but having a resolution based on at least a portion of the second reference clock signal; and
    a third input to receive a sample rate control input, wherein the first ratio is controlled by the sample rate control input.

15. The clock translator of claim 14, wherein the sample rate control input is a sample rate control input of a sample rate converter.

16. The clock translator of claim 14, wherein the sample rate control input is provided by a digital phase lock loop.

17. The clock translator of claim 14, further comprising:
    a first translation stage to calculate a second ratio between a rate of the second reference clock signal and a rate of the first reference clock signal;
    a second translation stage responsive to the first translation stage to provide the bit rate clock signal based on the sample rate control input.

18. The clock translator of claim 17, wherein the first translation stage includes an input module responsive to the first reference clock signal and a low pass filter responsive to the input module.

19. The clock translator of claim 18, wherein the low pass filter comprises an integrator, a feed forward value, and wherein the magnitude of the feed forward value is substantially subtracted from the integrator.

20. The clock translator of claim 17, wherein the second translation stage includes a delta-sigma modulator responsive to the sample rate control input.

21. The clock translator of claim 20, wherein the second translation stage comprises an accumulator responsive to the first translation stage, a comparator responsive to the accumulator and to a reference value, wherein the accumulator is further responsive to the sample rate control input when the comparator indicates a favorable condition of the accumulator with respect to the reference value.

22. The clock translator of claim 21, wherein the reference value is zero.

23. The clock translator of claim 14, wherein a rate of the first reference clock signal is asynchronous with respect to the second reference clock signal.

24. The clock translator of claim 14, wherein the bit rate clock signal includes a plurality of pulses, and wherein the plurality of pulses have a frequency in a first ratio with respect to the frequency of the first reference clock signal and wherein a first set of the plurality of pulses are synchronized with edge transitions of the second reference clock signal.

25. The clock translator of claim 14, wherein the second reference clock signal is at a faster rate than the first reference clock signal.

* * * * *